(12) United States Patent
Song et al.

(10) Patent No.: US 11,474,491 B2
(45) Date of Patent: Oct. 18, 2022

(54) COMMUNICATION METHOD BETWEEN MASTER CONTROLLER AND SLAVE CONTROLLER, SLAVE CONTROLLER FOR THE SAME, AND BATTERY MANAGEMENT SYSTEM USING THE SAME

(71) Applicants: SILICON WORKS CO., LTD., Daejeon (KR); LG CHEM, LTD., Seoul (KR)

(72) Inventors: Myoung Su Song, Daejeon (KR); Jae Wan Kim, Daejeon (KR); Jin Yong Jeon, Daejeon (KR); Ki Suk Cho, Daejeon (KR); Il Kwon Kim, Daejeon (KR); Seung Jun Choi, Daejeon (KR); Kyu Ho Kim, Daejeon (KR); Kyoung Choon Min, Daejeon (KR); Ki Young Lee, Daejeon (KR); Won Gon Kim, Daejeon (KR)

(73) Assignees: SILICON WORKS CO., LTD., Daejeon (KR); LG ENERGY SOLUTION, LTD., Seoul (KR)

(*) Notice: Subject to any disclaimer, the term of this patent is extended or adjusted under 35 U.S.C. 154(b) by 0 days.

(21) Appl. No.: 17/129,014

(22) Filed: Dec. 21, 2020

(65) Prior Publication Data

US 2021/0109492 A1 Apr. 15, 2021

Related U.S. Application Data

(62) Division of application No. 16/174,768, filed on Oct. 30, 2018, now Pat. No. 10,915,080.

(30) Foreign Application Priority Data

Oct. 31, 2017 (KR) .......................... 10-2017-0143817

(51) Int. Cl.
*G01N 27/416* (2006.01)
*G05B 19/042* (2006.01)
(Continued)

(52) U.S. Cl.
CPC ....... *G05B 19/0423* (2013.01); *G01R 31/392* (2019.01); *G01R 31/396* (2019.01);
(Continued)

(58) Field of Classification Search
CPC .. G01R 31/367; G01R 31/374; G01R 31/379; G01R 31/382; G01R 31/387;
(Continued)

(56) References Cited

U.S. PATENT DOCUMENTS

2007/0247115 A1* 10/2007 Ishikawa ............... H02J 7/0016
320/119
2012/0089352 A1* 4/2012 Librizzi ................ H02J 7/0021
702/63
(Continued)

FOREIGN PATENT DOCUMENTS

JP 2010-63939 A 3/2010
JP 2010-195133 A 9/2010
(Continued)

OTHER PUBLICATIONS

Extended European Search Report from corresponding European Patent Application No. 18203199.7, dated Mar. 22, 2019.
(Continued)

*Primary Examiner* — Thang X Le
(74) *Attorney, Agent, or Firm* — Harness, Dickey & Pierce, P.L.C.

(57) ABSTRACT

Disclosed are a communication method between a master controller and slave controllers, a slave controller for the communication method, and a battery management system using the communication method and the slave controller, in
(Continued)

which the master controller receives safety information about battery cells through a plurality of channels even when each of a plurality of slave controllers includes only one micro controller unit, thereby minimizing the increase in the cost and enhancing the safety of the battery management system. The communication method includes performing bidirectional communication between a master controller and first to $N^{th}$ (where N is an integer equal to or more than two) slave controllers through a first communication channel, and receiving, by the master controller, an indication signal through a second communication signal via the first to $N^{th}$ slave controllers.

11 Claims, 8 Drawing Sheets

(51) Int. Cl.
  *H02J 7/00* (2006.01)
  *H01M 10/42* (2006.01)
  *G01R 31/396* (2019.01)
  *G01R 31/392* (2019.01)
  *G01R 31/374* (2019.01)

(52) U.S. Cl.
  CPC ....... *H01M 10/4207* (2013.01); *H02J 7/0021* (2013.01); *H02J 7/0047* (2013.01); *G01R 31/374* (2019.01); *G05B 2219/21005* (2013.01); *G05B 2219/2231* (2013.01); *G05B 2219/25179* (2013.01); *G05B 2219/25257* (2013.01); *H01M 2010/4271* (2013.01); *H01M 2010/4278* (2013.01); *H02J 7/00302* (2020.01); *H02J 7/00306* (2020.01)

(58) Field of Classification Search
  CPC ............... G01R 31/389; G01R 31/392; G01R 31/3842; G01R 31/3606; G01R 31/3624; G01R 31/3634; G01R 31/3648; G01R 31/3651; G01R 31/3662; G01R 31/3665; G01R 31/3675; G01R 31/3679; G01R 324/426–437
  See application file for complete search history.

(56) References Cited

U.S. PATENT DOCUMENTS

| | | | |
|---|---|---|---|
| 2013/0026997 A1 | 1/2013 | Takeda et al. | |
| 2013/0119898 A1 | 5/2013 | Ohkura | |
| 2013/0234719 A1 | 9/2013 | Sekizaki et al. | |
| 2014/0018990 A1* | 1/2014 | Kataoka | H04Q 9/00 320/134 |
| 2014/0203782 A1 | 7/2014 | Xue et al. | |
| 2014/0315048 A1* | 10/2014 | Yang | H02J 7/0031 429/61 |
| 2014/0368040 A1* | 12/2014 | Chen | G01R 19/25 307/52 |
| 2015/0270727 A1* | 9/2015 | Fukute | H02J 7/0063 320/107 |
| 2016/0336770 A1 | 11/2016 | Benz et al. | |
| 2017/0271913 A1 | 9/2017 | Nasiri et al. | |
| 2018/0145519 A1 | 5/2018 | Trigiani | |

FOREIGN PATENT DOCUMENTS

| | | |
|---|---|---|
| JP | 2016-154437 A | 8/2016 |
| KR | 10-2010-0097504 A | 9/2010 |
| KR | 10-2014-0143076 A | 12/2014 |
| KR | 10-1540086 B1 | 7/2015 |
| KR | 10-2016-0107166 A | 9/2016 |
| WO | WO-2012/131797 A1 | 10/2012 |

OTHER PUBLICATIONS

Office Action dated Aug. 6, 2020, issued in U.S. Appl. No. 16/174,768.
Office Action from corresponding Korean Patent Application No. 10-2017-0143817, dated May 12, 2022.
Office Action from corresponding Japanese Patent Application No. 2018-203164, dated Aug. 30, 2022.

* cited by examiner

COMMUNICATION METHOD BETWEEN MASTER CONTROLLER AND SLAVE CONTROLLER, SLAVE CONTROLLER FOR THE SAME, AND BATTERY MANAGEMENT SYSTEM USING THE SAME

CROSS-REFERENCE TO RELATED APPLICATIONS

This application is a divisional application of U.S. Ser. No. 16/174,768 filed Oct. 30, 2018, which claims the benefit of Korean Patent Application No. 10-2017-0143817, filed Oct. 31, 2017 in the Korean Intellectual Property Office, the disclosure of which is incorporated herein by reference in its entirety.

FIELD

The present disclosure relates to a communication method between a master controller and slave controllers, a slave controller for the communication method, and a battery management system using the communication method and the slave controller.

BACKGROUND

Recently, as communication and computer industries advance rapidly, products using a secondary battery are increasing. In detail, secondary batteries are being generally applied to portable electronic devices, hybrid electric vehicles (HEVs), electric vehicles (EVs), energy storage systems, etc.

When high power is needed like HEVs or EVs, secondary batteries each including a plurality of battery cells serially connected to one another are used. In this case, a battery management system (BMS) may be additionally provided and may include a plurality of cell module controllers for monitoring and controlling the plurality of battery cells and a master controller for controlling the plurality of cell module controllers. The cell module controllers may be controlled by the master controller, and thus, may be referred to as slave controllers. Each of the slave controllers may use a micro controller unit (MCU) as a processor.

In order to apply the MCU to HEVs or EVs, a certain safety level should be granted in an automotive safety integrity level (ASIL) of ISO 26262 which is automotive function safety international standard. To this end, each of the slave controllers using the MCU uses dual-core lockstep technology including a plurality of MCUs generally. The dual-core lockstep technology denotes technology which adds the same sub-processor as a main processor so as to monitor and check an operation of the main processor. In a case where each of the slave controllers uses the dual-core lockstep technology, the number of MCUs increases, and the complexity of the MCUs increases, causing the increase in the manufacturing cost.

SUMMARY

Accordingly, the present disclosure is directed to providing a communication method between a master controller and slave controllers, a slave controller for the communication method, and a battery management system using the communication method and the slave controller that substantially obviate one or more problems due to limitations and disadvantages of the related art.

An aspect of the present disclosure is directed to providing a communication method between a master controller and slave controllers, a slave controller for the communication method, and a battery management system using the communication method and the slave controller, in which the master controller receives safety information about battery cells through a plurality of channels even when each of a plurality of slave controllers includes only one micro controller unit, thereby minimizing the increase in the cost and enhancing the safety of the battery management system.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a communication method including performing bidirectional communication between a master controller and first to $N^{th}$ (where N is an integer equal to or more than two) slave controllers through a first communication channel, the master controller being connected to the first to $N^{th}$ slave controllers through the first communication channel in parallel, and receiving, by the master controller, an indication signal through a second communication channel via the first to $N^{th}$ slave controllers, the master controller being serially connected to the first to $N^{th}$ slave controllers through the second communication channel in a daisy chain manner.

In another aspect of the present disclosure, there is provided a slave controller including a first voltage sensing unit and a second voltage sensing unit connected to both ends of a battery cell to sense a voltage of the battery cell and a micro controller unit (MCU) converting a first sensing voltage from the first voltage sensing unit into voltage information data which is digital data, outputting the voltage information data to a first communication channel, determining whether the battery cell is overcharging or overdischarging, based on the second sensing voltage from the second voltage sensing unit, and outputting an indication signal to the second communication channel.

In another aspect of the present disclosure, there is provided a battery management system including first to $N^{th}$ (where N is an integer equal to or more than two) battery cells, first to $N^{th}$ slave controllers respectively connected to the first to $N^{th}$ battery cells, and a master controller connected to the first to $N^{th}$ slave controllers through a first communication channel in parallel and serially connected to the first to $N^{th}$ slave controllers through a second communication channel in a daisy chain manner.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
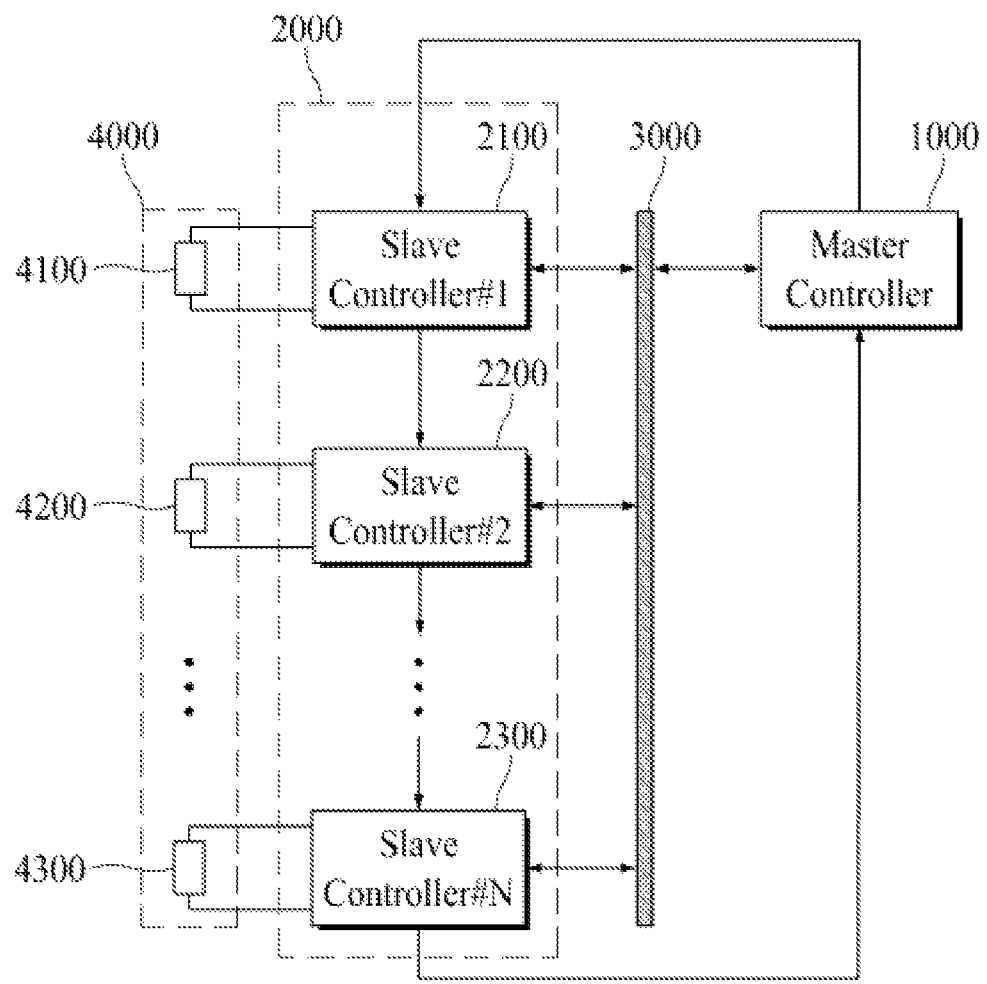
FIG. 1 is a perspective view illustrating a battery management system according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

FIG. 1 is a perspective view illustrating a battery management system (BMS) according to an embodiment of the present disclosure.

Referring to FIG. 1, the BMS may include a master controller 1000, a slave controller group 2000, a bus line 3000, and a battery cell group 4000. The slave controller group 2000 may include first to $N^{th}$ (where N is an integer equal to or more than two) slave controllers 2100, 2200, and 2300, and the battery cell group 4000 may include first to $N^{th}$ battery cells 4100, 4200, and 4300.

The master controller 1000 may be connected to the first to $N^{th}$ slave controllers 2100, 2200, and 2300 through a first communication channel in parallel. The first communication channel may include the bus line 3000 disposed between the master controller 1000 and the slave controller group 2000. That is, the master controller 1000 and the first to $N^{th}$ slave controllers 2100, 2200, and 2300 may share the bus line 3000. In this case, the master controller 1000 may communicate with the first to $N^{th}$ slave controllers 2100, 2200, and 2300 through the bus line 3000, based on controller area network (CAN) communication. However, an embodiment of the present disclosure is not limited thereto, and the master controller 1000 may communicate with the first to $N^{th}$ slave controllers 2100, 2200, and 2300, based on universal asynchronous receiver/transmitter (UART) communication.

The master controller 1000 may perform bidirectional communication with the first to $N^{th}$ slave controllers 2100, 2200, and 2300 through the first communication channel. For example, the master controller 1000 may perform bidirectional communication with the first to $N^{th}$ slave controllers 2100, 2200, and 2300, thereby controlling battery cell balancing. In detail, each of the first to $N^{th}$ slave controllers 2100, 2200, and 2300 may transmit voltage information data and temperature information data of a corresponding battery cell to the master controller 1000. In this case, the master controller 1000 may analyze voltage information data and temperature information data of each of the first to $N^{th}$ battery cells 4100, 4200, and 4300 to calculate cell balancing information data for balancing of the first to $N^{th}$ battery cells 4100, 4200, and 4300. Subsequently, the master controller 1000 may transmit the cell balancing information data to each of the first to $N^{th}$ slave controllers 2100, 2200, and 2300. Each of the first to $N^{th}$ slave controllers 2100, 2200, and 2300 may perform battery cell balancing, based on the cell balancing information data.

Moreover, the master controller 1000 may analyze the voltage information data and temperature information data of each of the first to $N^{th}$ battery cells 4100, 4200, and 4300 to calculate a state of charge (SOC), a state of health (SOH), and safety information of each of the first to $N^{th}$ battery cells 4100, 4200, and 4300. The master controller 1000 may control a switching unit connecting the first to $N^{th}$ battery cells 4100, 4200, and 4300 to a power source or a load to control charging or discharging of the first to $N^{th}$ battery cells 4100, 4200, and 4300, based on the SOC, the SOH, and the safety information.

The master controller 1000 may be serially connected to the first to $N^{th}$ slave controllers 2100, 2200, and 2300 through a second communication channel, based on a daisy chain manner. That is, as in FIG. 1, the master controller 1000 may be connected to the first to $N^{th}$ slave controllers 2100, 2200, and 2300 in a ring structure.

The master controller 1000 may receive, through the second communication channel, an indication signal transmitted via the first to $N^{th}$ slave controllers 2100, 2200, and 2300. The indication signal may be a signal which indicates safety information about the first to $N^{th}$ battery cells 4100, 4200, and 4300. When a first indication signal is input, the master controller 1000 may determine a voltage and a temperature of each of the first to $N^{th}$ battery cells 4100, 4200, and 4300 as normal, and when a second indication signal is input, the master controller 1000 may determine a voltage and a temperature of at least one of the first to $N^{th}$ battery cells 4100, 4200, and 4300 as abnormal.

Figure 4:
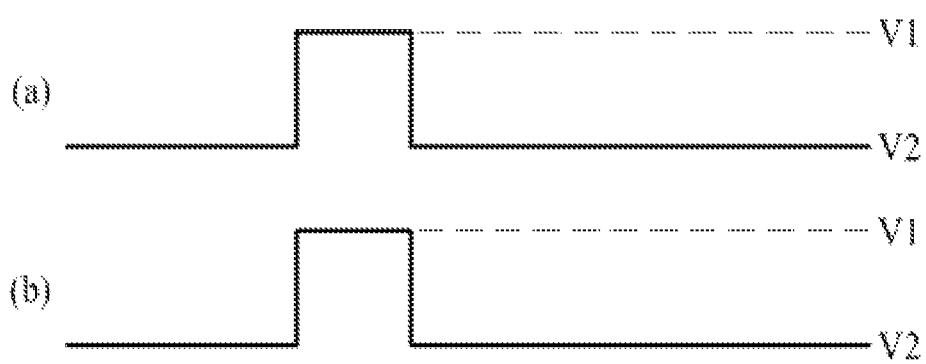
FIG. 4 is a waveform diagram showing a first indication signal input to a slave controller and a second indication signal output from the slave controller when a sensing voltage of a battery cell is equal to or greater than a first voltage threshold value or is equal to or less than a second voltage threshold value or a temperature of the battery cell is equal to or greater than a first temperature threshold value or is equal to or less than a second temperature threshold value.
Figure 5:
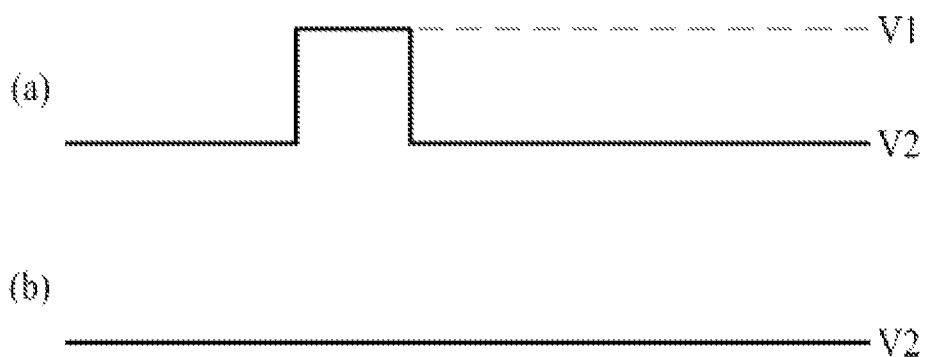
FIG. 5 is a waveform diagram showing a first indication signal input to a slave controller and a second indication signal output from the slave controller when a sensing voltage of a battery cell is between a first voltage threshold value and a second voltage threshold value or a temperature of the battery cell is between a first temperature threshold value and a second temperature threshold value.

The indication signal may be a pulse-type voltage signal as in FIGS. 4 and 5. For example, the first indication signal may be a voltage signal having a pulse of a first logic level voltage V1 as in FIGS. 4 (a) and (b) and FIG. 5 (a), and the second indication signal may be a voltage signal having a second logic level voltage V2 as in FIG. 5 (b). Alternatively, the indication signal may be digital data. For example, the first indication signal may be 8-bit data "11111111", the first indication signal may be 8-bit data "00000000". However, the indication signal is not limited thereto.

The master controller 1000 may overall control the BMS, and thus, may be referred to as a battery master controller. The first to $N^{th}$ slave controllers 2100, 2200, and 2300 may respectively control the first to $N^{th}$ battery cells 4100, 4200, and 4300, and thus, may be referred to as cell module controllers.

The battery cell group 4000 may include the first to $N^{th}$ battery cells 4100, 4200, and 4300. In FIG. 1, for convenience of description, only the first, second, and $N^{th}$ battery cells 4100, 4200, and 4300 are illustrated.

Each of the first to $N^{th}$ battery cells 4100, 4200, and 4300 may include a secondary battery which is changeable or dischargeable. For example, the secondary battery of each of the first to $N^{th}$ battery cells 4100, 4200, and 4300 may be implemented as one of a nickel-cadmium (Ni—Cd) battery, a Ni-hydrogen (Ni—H) battery, and a lithium (Li) battery, but is not limited thereto. Each of the first to $N^{th}$ battery cells 4100, 4200, and 4300 may include a plurality of secondary batteries, and in this case, the secondary batteries may be serially connected to one another.

As described above, in an embodiment of the present disclosure, the master controller 1000 may communicate with a plurality of slave controllers (for example, the first to $N^{th}$ slave controllers 2100, 2200, and 2300) by using a plurality of communication channels (for example, the first communication channel and the second communication channel). As a result, according to an embodiment of the present disclosure, despite a problem occurring in the first communication channel corresponding to a main communication channel, the master controller 1000 may receive, through the second communication channel corresponding to a sub communication channel, an indication signal indicating which at least one of the first to $N^{th}$ battery cells 4100, 4200, and 4300 is normal or abnormal in voltage and temperature. Accordingly, according to an embodiment of the present disclosure, the safety of the BMS is enhanced.

Hereinafter, the master controller 1000 will be described in detail with reference to FIG. 2, and the first to $N^{th}$ slave controllers 2100, 2200, and 2300 will be described in detail with reference to FIG. 3.

Figure 2:
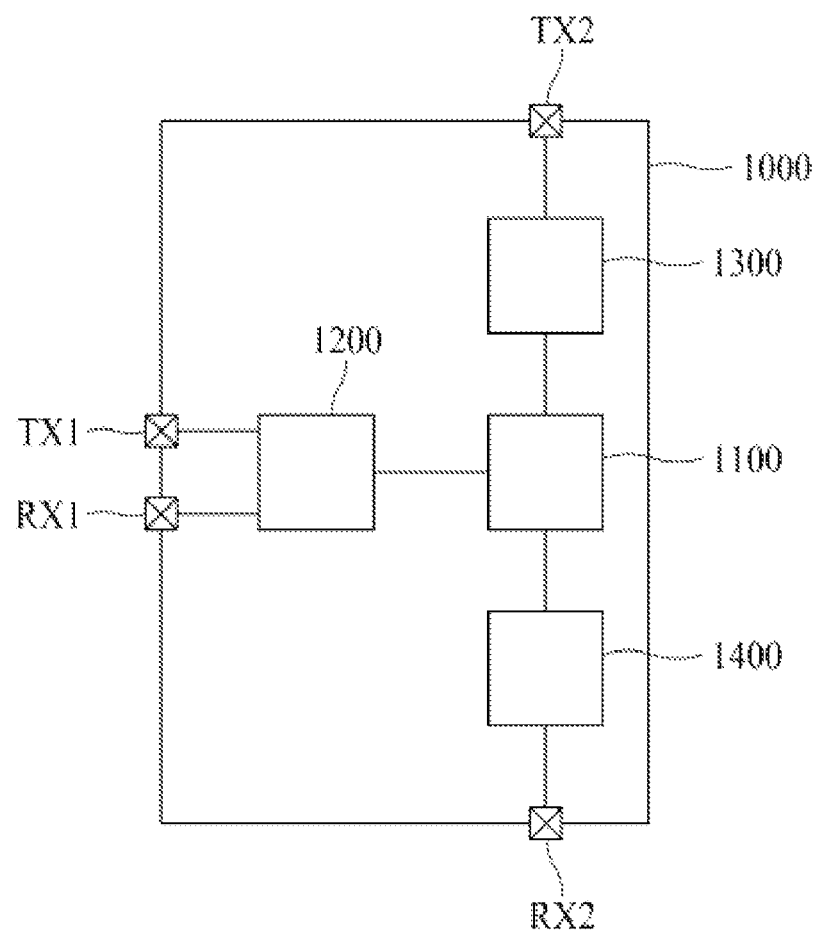
FIG. 2 is a block diagram illustrating in detail a master controller of FIG. 1.

FIG. 2 is a block diagram illustrating in detail the master controller of FIG. 1.

Referring to FIG. 2, the master controller 1000 may include a control unit 1100, a first transceiver 1200, a second transmitter 1300, and a second receiver 1400.

The control unit 1100 may receive voltage information data and temperature information data of each of the first to $N^{th}$ battery cells 4100, 4200, and 4300 transmitted from the first to $N^{th}$ slave controllers 2100, 2200, and 2300.

The control unit 1100 may analyze the voltage information data and temperature information data of each of the first to $N^{th}$ battery cells 4100, 4200, and 4300 to calculate control information data for controlling the first to $N^{th}$ battery cells 4100, 4200, and 4300. For example, the control information data may be cell balancing information data for balancing of the first to $N^{th}$ battery cells 4100, 4200, and 4300. Battery cell balancing may denote an operation of uniformly adjusting charged voltages of the plurality of secondary batteries included in each of the first to $N^{th}$ battery cells 4100, 4200, and 4300. When the battery cell balancing is not performed, degrees of degradation of the plurality of secondary batteries included in each of the first to $N^{th}$ battery cells 4100, 4200, and 4300 may differ, and due to this, a degree of degradation of a secondary battery which is much degraded is further worsened, the secondary battery may fire or explode. The control unit 1100 may output the control information data to the first transceiver 1200.

The control unit 1100 may analyze the voltage information data and temperature information data of each of the first to N$^{th}$ battery cells 4100, 4200, and 4300 to calculate an SOC, an SOH, and safety information of each of the first to N$^{th}$ battery cells 4100, 4200, and 4300. The control unit 1100 may control the switching unit connecting the first to N$^{th}$ battery cells 4100, 4200, and 4300 to the power source or the load to control charging or discharging of the first to N$^{th}$ battery cells 4100, 4200, and 4300, based on the SOC, the SOH, and the safety information. To this end, the control unit 1100 may generate switching control signals, based on the SOC, the SOH, and the safety information and may output the switching control signals to the switching unit.

The control unit 1100 may receive, through the second receiver 1400, the indication signal transmitted from the N$^{th}$ slave controller 2300. When the first indication signal is input, the control unit 1100 may determine a voltage and a temperature of each of the first to N$^{th}$ battery cells 4100, 4200, and 4300 as normal, and when the second indication signal is input, the control unit 1100 may determine a voltage and a temperature of at least one of the first to N$^{th}$ battery cells 4100, 4200, and 4300 as abnormal.

When it is determined that a voltage and a temperature of at least one of the first to N$^{th}$ battery cells 4100, 4200, and 4300 are abnormal, the control unit 1100 may communicate with the first to N$^{th}$ slave controllers 2100, 2200, and 2300 through the first transceiver 1200 and may receive the voltage information data and the temperature information data from each of the first to N$^{th}$ slave controllers 2100, 2200, and 2300. The control unit 1100 may detect an abnormal battery cell, based on the voltage information data and temperature information data from each of the first to N$^{th}$ slave controllers 2100, 2200, and 2300.

The first transceiver 1200 may be a communication module for communicating with the first to N$^{th}$ slave controllers 2100, 2200, and 2300 through the first communication channel. The first transceiver 1200 may convert control information data, transferred from the control unit 1100, into a communication packet suitable for the first communication channel and may transmit the communication packet to the first to N$^{th}$ slave controllers 2100, 2200, and 2300 through a first transmission terminal TX1. The first transceiver 1200 may convert the communication packet, received through a first reception terminal RX1 from each of the first to N$^{th}$ slave controllers 2100, 2200, and 2300, into voltage information data and temperature information data and may output the voltage information data and the temperature information data to the control unit 1100.

The second transmitter 1300 may be a communication module for transmitting the first indication signal to the first slave controller 2100. The first indication signal may be a voltage signal having the first logic level voltage V1 as in FIGS. 4 (a) and (b) and FIG. 5 (a), or may be digital data having a certain value such as "11111111".

When the first indication signal is digital data, the second transmitter 1300 may convert the first indication signal into a communication packet and may output the communication packet to a second transmission terminal TX2. In this case, the second transmitter 1300 may communicate with the first slave controller 2100, based on serial peripheral interface (SPI) communication.

When the first indication signal is a pulse-type voltage signal, the second transmitter 1300 may be omitted. That is, when the first indication signal is the pulse-type voltage signal, the first indication signal may be directly output from the control unit 1100.

The second receiver 1400 may be a communication module for outputting the indication signal, transmitted from the N$^{th}$ slave controller 2300, to the control unit 1100. The indication signal may be the first indication signal or the second indication signal.

When the first indication signal is digital data, the second receiver 1400 may convert a communication packet, transmitted from the N$^{th}$ slave controller 2300, into an indication signal and may output the indication signal to the control unit 1100. In this case, the second receiver 1400 may communicate with the N$^{th}$ slave controller 2300, based on the SPI communication.

When the indication signal transmitted from the N$^{th}$ slave controller 2300 is a pulse-type voltage signal, the second receiver 1400 may be omitted. That is, when the indication signal is the pulse-type voltage signal, the indication signal may be directly input to the control unit 1100.

Figure 3:
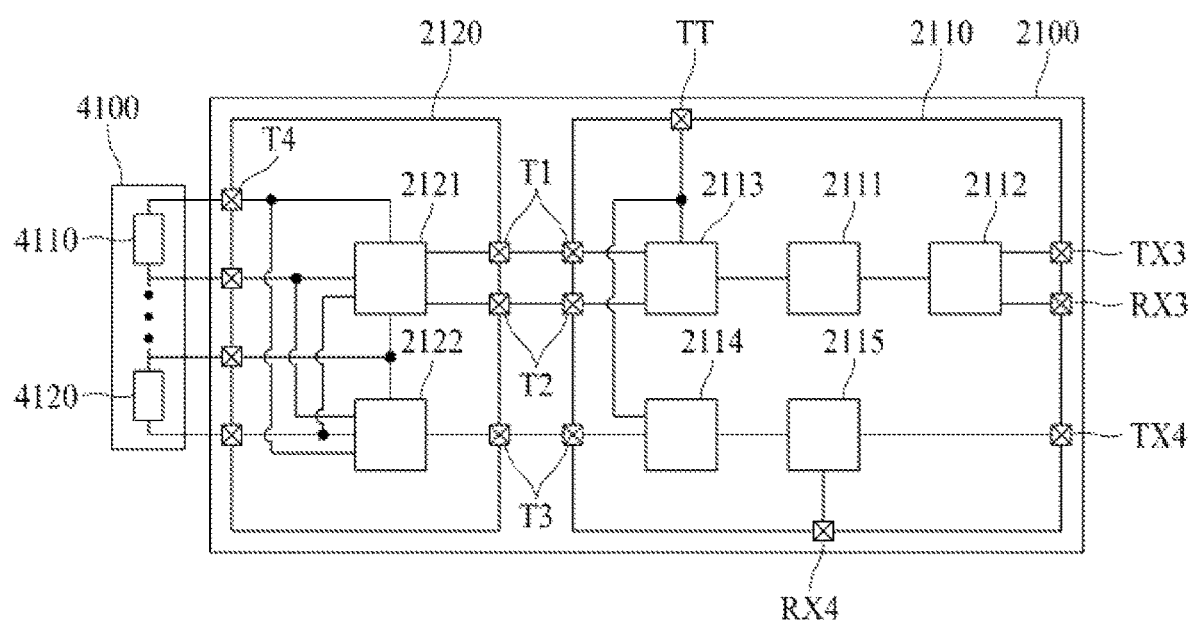
FIG. 3 is a block diagram illustrating in detail a battery cell and a slave controller of FIG. 1.

FIG. 3 is a block diagram illustrating in detail the first battery cell and the first slave controller of FIG. 1.

Referring to FIG. 3, the first slave controller 2100 may include a micro controller unit (MCU) 2110 and a voltage sensing unit 2120.

The MCU 2110 may receive a first sensing voltage and a second sensing voltage from the voltage sensing unit 2120 and may receive a sensing temperature of the first battery cell 1400 from a temperature reception terminal TT. The MCU 2110 may convert the first sensing voltage into voltage information data which is digital data, convert the sensing temperature into temperature information data which is digital data, and transmit the voltage information data and the temperature information data to the master controller 1000 through the first communication channel. The MCU 2110 may determine the overcharging, over-discharging, or overheating of the first battery cell 4100, based on the second sensing voltage and the sensing temperature.

In detail, as in FIG. 3, the MCU 2110 may include a central processing unit (CPU) 2111, a communication module 2112, an analog-to-digital converter (ADC) 2113, a comparator 2114, and an indication signal output unit 2115.

The CPU 2111 may receive voltage information data and temperature information data from the ADC 2113. The CPU 2111 may output the voltage information data and the temperature information data to the communication module 2112, for transmitting the voltage information data and the temperature information data to the master controller 1000 through the first communication channel.

Moreover, the CPU 2111 may receive control information data from the communication module 2112 and may control the first battery cell 4100, based on the control information data. For example, the CPU 2111 may receive cell balancing information data as an example of the control information data and may control the cell balancing of the first battery cell 4100, based on the cell balancing information data. In this case, the first slave controller 2100 may further include a cell balancing unit connected to the first battery cell 4100. The cell balancing unit may include a plurality of switches for forming a discharging path in each of the secondary batteries of the first battery cell 4100. The CPU 2111 may output, to the cell balancing unit, switch signals for controlling the switches of the cell balancing unit, based on the cell balancing information data.

The communication module 2112 may be a module for communicating with the master controller 1000 through the first communication channel. The communication module 2112 may convert each of the voltage information data and the temperature information data, received from the CPU 211, into a communication packet suitable for the first communication channel and may transmit the communication packet to the master controller 1000 through a third transmission terminal TX3. Also, the communication module 2112 may convert the communication packet, received through a third reception terminal RX3 from the master controller 1000, into control information data and may output the control information data to the CPU 2111.

The ADC 2113 may receive the first sensing voltage through first and second terminals T1 and T2 from the voltage sensing unit 2120 and may receive the sensing temperature of the first battery cell 4100 through the temperature reception terminal TT. The ADC 2113 may convert the first sensing voltage into the voltage information data which is digital data, and may convert the sensing temperature into the temperature information data which is digital data. The ADC 2113 may output the voltage information data and the temperature information data to the CPU 2111.

The comparator 2114 may receive the second sensing voltage through a third terminal T3 from the voltage sensing unit 2120 and may receive the sensing temperature of the first battery cell 4100 through the temperature reception terminal TT. The comparator 2114 may compare the second sensing voltage with the first voltage threshold value and the second voltage threshold value, compare the sensing temperature with the first temperature threshold value and the second temperature threshold value, and output a comparison signal based on a comparison result.

In detail, when the second sensing voltage is between the first voltage threshold value and the second voltage threshold value and the sensing temperature is between the first temperature threshold value and the second temperature threshold value, the comparator 2114 may output a first comparison signal. When the second sensing voltage is equal to or greater than the first voltage threshold value or is equal to or less than the second voltage threshold value and the sensing temperature is equal to or greater than the first temperature threshold value or is equal to or less than the second temperature threshold value, the comparator 2114 may output a second comparison signal.

The first voltage threshold value may be a voltage threshold value which is a criterion of the overcharging of the first battery cell 4100, and the second voltage threshold value may be a voltage threshold value which is a criterion of the over-discharging of the first battery cell 4100. The first voltage threshold value may be a value which is higher than the second voltage threshold value. Also, the first temperature threshold value may be a temperature threshold value which is a criterion of the overheating of the first battery cell 4100, and the second temperature threshold value may be a temperature threshold value which is a criterion of a low temperature of the first battery cell 4100. The first temperature threshold value may be a value which is higher than the second temperature threshold value.

The indication signal output unit 2115 may output an indication signal to a fourth transmission terminal TX4, based on an indication signal transmitted through a fourth reception terminal RX4 and the comparison signal from the comparator 2114. In detail, when a first indication signal is input through the fourth reception terminal RX4 and the first comparison signal is input from the comparator 2114 as in FIG. 4 (a), the indication signal output unit 2115 may output the first indications signal to the fourth transmission terminal TX4 as in FIG. 4 (b). In FIG. 4, an example where the first indication signal is a voltage signal having the pulse of the first logic level voltage V1 is illustrated.

Moreover, when the first indication signal is input through the fourth reception terminal RX4 and the second comparison signal is input from the comparator 2114 as in FIG. 5 (a), the indication signal output unit 2115 may output the second indications signal to the fourth transmission terminal TX4 as in FIG. 5 (b). In FIG. 5, an example where the first indication signal is a voltage signal having the pulse of the first logic level voltage V1 and the second indication signal is a voltage signal having the second logic level voltage V2 is illustrated.

Moreover, when the second indication signal is input through the fourth reception terminal RX4, the indication signal output unit 2115 may output the second indications signal to the fourth transmission terminal TX4.

The voltage sensing unit 2120 may include a first voltage sensing unit 2121 and a second voltage sensing unit 2122. The first voltage sensing unit 2121 and the second voltage sensing unit 2122 may be respectively connected to both ends of the first battery cell 4100 to sense a voltage of the first battery cell 4100. For example, the first voltage sensing unit 2121 and the second voltage sensing unit 2122 may be respectively connected to both ends of each of secondary batteries 4110 and 4120 of the first battery cell 4100 through a fourth terminal T4, thereby sensing a voltage of each of the secondary batteries 4110 and 4120.

The first voltage sensing unit 2121 may output at least one sensing voltage, sensed from the first battery cell 4100, as a first sensing voltage to the ADC 2113 through the first and second terminals T1 and T2. The first voltage sensing unit 2121 may transmit the first sensing voltage in differential signal form by using two signal lines to the ADC 2113.

The second voltage sensing unit 2122 may output at least one sensing voltage, sensed from the first battery cell 4100, as a second sensing voltage to the comparator 2114 through the third terminal T3. The second voltage sensing unit 2122 may transmit the second sensing voltage to the comparator 2114 by using one signal line.

The first sensing voltage may be converted into voltage information data by the ADC 2113, and the voltage information data may be transmitted to the master controller 1000 through the first communication channel, whereas the second sensing voltage may be compared with the first and second voltage threshold values by the comparator 2114. That is, the first sensing voltage may be a value which is used for the master controller 1000 to analyze cell balancing, an SOC, an SOH, and safety information, and the second sensing value may be a value which is compared with the first voltage threshold value corresponding to an upper limit threshold value and the second voltage threshold value corresponding to a lower limit threshold value. Therefore, it is important that the first sensing voltage is accurately transmitted in comparison with the second sensing voltage. Accordingly, in an embodiment of the present disclosure, the first sensing voltage may be transmitted in a differential signal form by using two signal lines to the ADC 2113, and thus, may be transmitted as a value which is more accurate than a case where the first sensing voltage is transmitted by using one signal line. Also, in an embodiment of the present disclosure, the second sensing voltage may be transmitted by using one signal line, thereby reducing circuit complexity and the cost.

As described above, in an embodiment of the present disclosure, the master controller 1000 may communicate with the plurality of slave controllers 2100, 2200, and 2300 by using a plurality of communication channels (for example, the first communication channel and the second communication channel). Particularly, according to an embodiment of the present disclosure, the first communication channel may be used as a main communication channel for transmitting or receiving digital data such as voltage information data, temperature information data, and control information data, and the second communication channel may be used as a sub communication channel for receiving an indication signal indicating safety information about battery cells. As a result, according to an embodiment of the present disclosure, in order for each of the plurality of slave controllers 2100, 2200, and 2300 to transmit the indication signal through the second communication channel, the comparator 2114, the indication signal output unit 2115, and the second voltage sensing unit 2122 may be added to the MCU 2110, but a separate MCU is not needed. That is, according to an embodiment of the present disclosure, even when each of the plurality of slave controllers 2100, 2200, and 2300 includes only one MCU 2110, the master controller 1000 may receive safety information about the battery cells through the plurality of communication channels. Accordingly, according to an embodiment of the present disclosure, the increase in the cost is minimized, and moreover, the safety of the BMS is enhanced.

Moreover, each of the second to $N^{th}$ slave controllers 2200 and 2300 may be configured to have a configuration which is substantially the same as that of the first slave controller 2100, and thus, their detailed descriptions are omitted.

Figure 6:
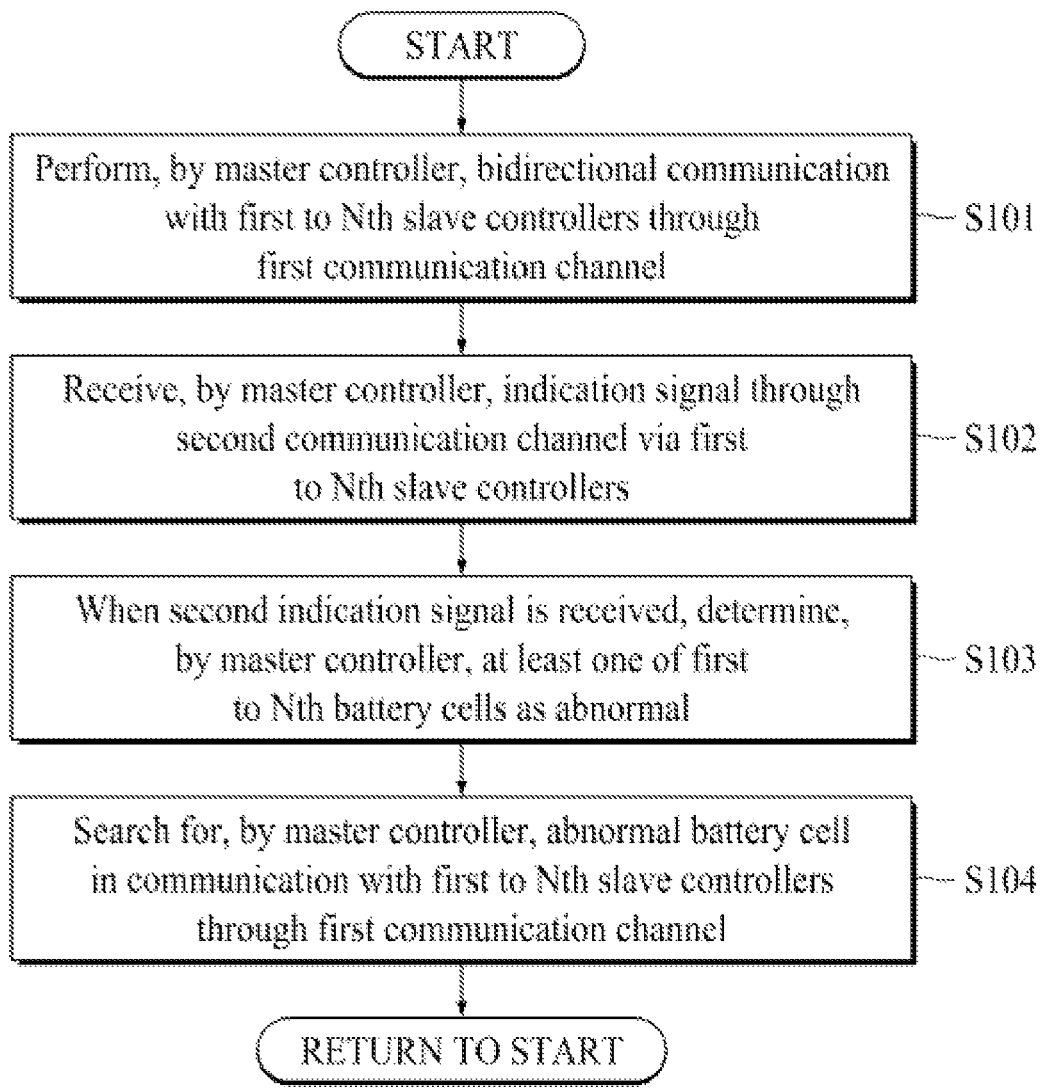
FIG. 6 is a flowchart illustrating a communication method between a master controller and slave controllers, according to an embodiment of the present disclosure.

FIG. 6 is a flowchart illustrating a communication method between a master controller and slave controllers, according to an embodiment of the present disclosure.

Hereinafter, a communication method between a master controller and slave controllers according to an embodiment of the present disclosure will be described in detail with reference to FIG. 6 in conjunction with FIG. 1.

Referring to FIG. 6, first, the master controller 1000 may perform bidirectional communication with the first to $N^{th}$ slave controllers 2100, 2200, and 2300 through the first communication channel. (S101 of FIG. 6)

Figure 7:
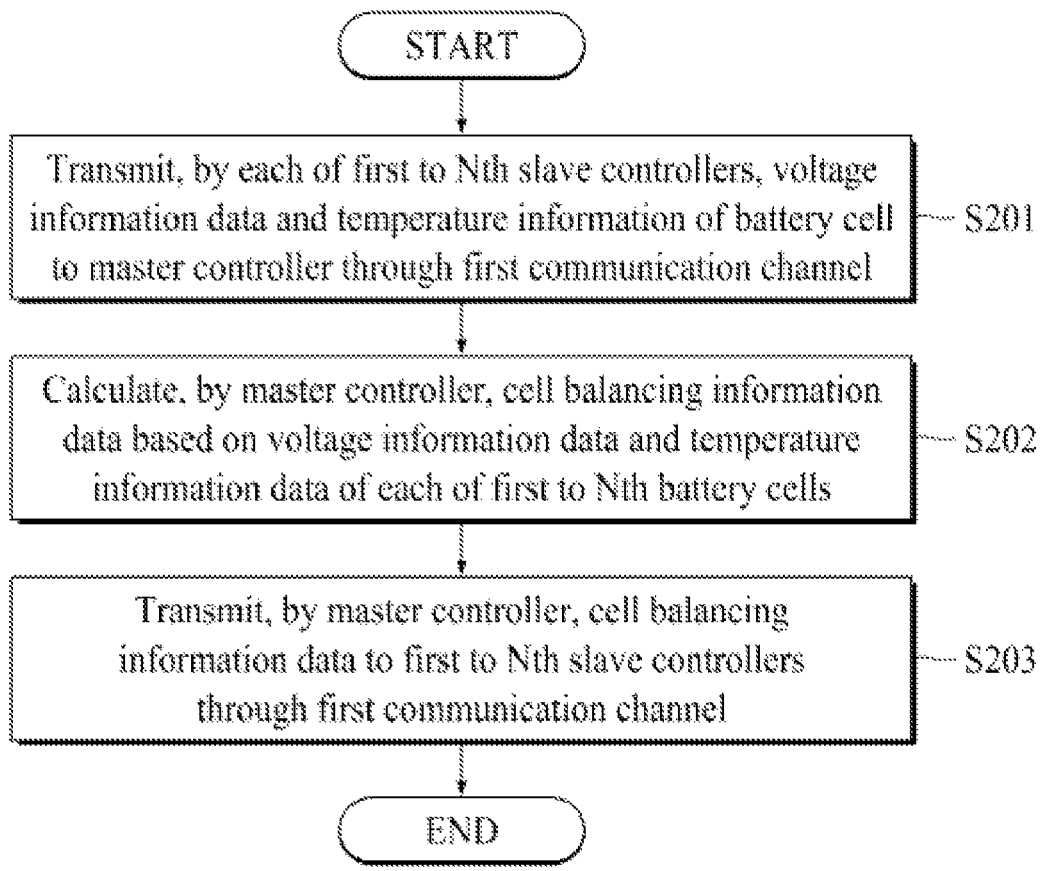
FIG. 7 is a flowchart illustrating in detail a communication method performed between a master controller and slave controllers by using a first communication channel, according to an embodiment of the present disclosure.

Bidirectional communication by the master controller 1000 will be described below in detail with reference to FIG. 7.

First, the master controller 1000 may receive, through the first communication channel, voltage information data and temperature information data from each of the first to $N^{th}$ slave controllers 2100, 2200, and 2300. In detail, each of the first to $N^{th}$ slave controllers 2100, 2200, and 2300 may convert a first sensing voltage of a corresponding battery cell into voltage information data which is digital data, convert a sensing temperature of the corresponding battery cell into temperature information data which is digital data, and transmit the voltage information data and the temperature information data to the master controller 1000 through the first communication channel. (S201 of FIG. 7)

Subsequently, the master controller 1000 may analyze voltage information data and temperature information data of each of the first to $N^{th}$ battery cells 4100, 4200, and 4300 to calculate control information data for controlling the first to $N^{th}$ battery cells 4100, 4200, and 4300. (S202 of FIG. 7)

The master controller 1000 may transmit the control information data to each of the first to $N^{th}$ slave controllers 2100, 2200, and 2300 through the first communication channel. Each of the first to $N^{th}$ slave controllers 2100, 2200, and 2300 may control the corresponding battery cell, based on the control information data. (S203 of FIG. 7)

Second, the master controller 1000 may receive, through the second communication channel, an indication signal transmitted via the first to $N^{th}$ slave controllers 2100, 2200, and 2300. (S102 of FIG. 6)

Figure 8:
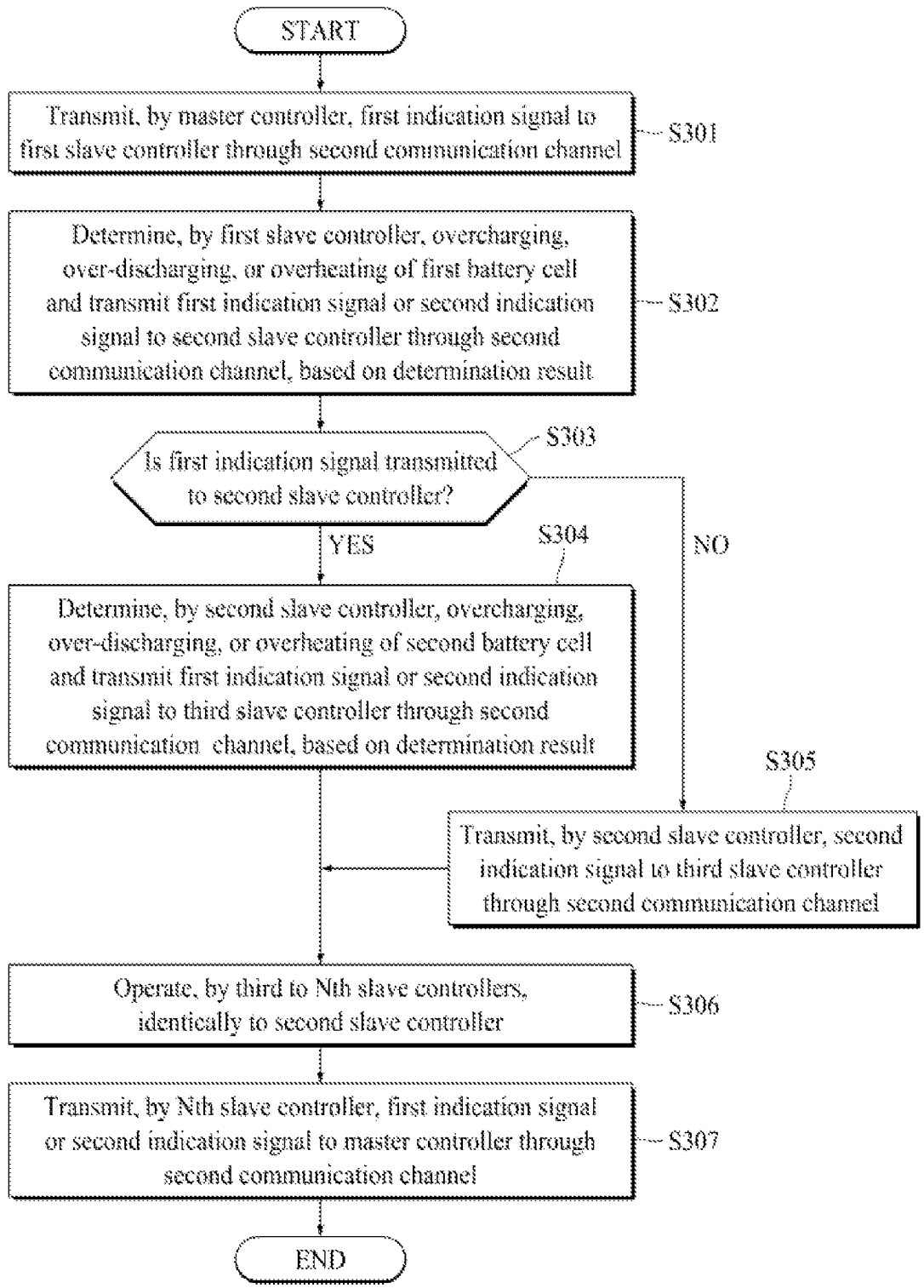
FIG. 8 is a flowchart illustrating in detail a communication method performed between a master controller and slave controllers by using a second communication channel, according to an embodiment of the present disclosure.

Transmission of the indication signal by the mater controller 1000 and the first to $N^{th}$ slave controllers 2100, 2200, and 2300 will be described below with reference to FIG. 8.

First, the master controller 1000 may transmit a first indication signal to the first slave controller 2100 through the second communication channel. (S301 of FIG. 8)

The first slave controller 2100 may determine whether the first battery cell 4100 is abnormal or not, based on a first sensing voltage or a sensing temperature of the first battery cell 4100 and may transmit the first indication signal or a second indication signal to the second slave controller 2200 through the second communication channel, based on a result of the determination. For example, when it is determined that the first battery cell 4100 is normal, the first slave controller 2100 may transmit the first indication signal to the second slave controller 2200 through the second communication channel. When it is determined that the first battery cell 4100 is abnormal, the first slave controller 2100 may transmit the second indication signal to the second slave controller 2200 through the second communication channel.

Determining whether the first battery cell 4100 is abnormal or not may denote an operation of determining the overcharging, over-discharging, or overheating of the first battery cell 4100. As described above with reference to FIG. 3, the comparator 2114 may compare the second sensing voltage with the first voltage threshold value and the second voltage threshold value and may compare the sensing temperature with the first temperature threshold value and the second temperature threshold value, thereby determining whether the first battery cell 4100 is abnormal or not. (S302 of FIG. 8)

When the first indication signal is transmitted through the second communication channel from the first slave controller 2100, the second slave controller 2200 may determine whether the second battery cell 4200 is abnormal or not and may transmit the first indication signal or the second indication signal to the third slave controller 2300 through the second communication channel, based on a result of the determination. For example, when it is determined that the second battery cell 4200 is normal, the second slave controller 2200 may transmit the first indication signal to the third slave controller 2300 through the second communication channel. When it is determined that the second battery cell 4200 is abnormal, the second slave controller 2200 may transmit the second indication signal to the third slave controller 2300 through the second communication channel. (S303 and S304 of FIG. 8)

Moreover, when the second indication signal is transmitted through the second communication channel from the first slave controller 2100, the second slave controller 2200 may transmit the second indication signal to the third slave controller 2300 through the second communication channel. (S305 of FIG. 8)

The third to $N^{th}$ slave controllers 2300 may operate identical to the second slave controller 2200. (S306 of FIG. 8)

The $N^{th}$ slave controller 2300 may transmit the first indication signal or the second indication signal to the master controller 1000 through the second communication channel. (S307 of FIG. 8)

Third, when the second indication signal is received through the second communication channel from the $N^{th}$ slave controller 2300, the master controller 1000 may determine a voltage and a temperature of at least one of the first to $N^{th}$ battery cells 4100, 4200, and 4300 as abnormal. (S103 of FIG. 6)

Fourth, when it is determined that a voltage and a temperature of at least one of the first to $N^{th}$ battery cells 4100, 4200, and 4300 is abnormal, the master controller 1000 may search for abnormal battery cells in communication with the first to $N^{th}$ slave controllers 2100, 2200, and 2300 through the first communication channel. The master controller 1000 may receive voltage information data and temperature information data through the first communication channel from the first to $N^{th}$ slave controllers 2100, 2200, and 2300 and may analyze the voltage information data and the temperature information data to detect the abnormal battery cells. (S104 of FIG. 6)

As described above, in an embodiment of the present disclosure, the master controller 1000 may communicate with the plurality of slave controllers 2100, 2200, and 2300 by using a plurality of communication channels (for example, the first communication channel and the second communication channel). Particularly, according to an embodiment of the present disclosure, the first communication channel may be used as a main communication channel for transmitting or receiving digital data such as voltage information data, temperature information data, and control information data, and the second communication channel may be used as a sub communication channel for receiving an indication signal indicating safety information about battery cells. As a result, according to an embodiment of the present disclosure, in order for each of the plurality of slave controllers 2100, 2200, and 2300 to transmit the indication signal through the second communication channel, the comparator 2114, the indication signal output unit 2115, and the second voltage sensing unit 2122 may be added to the MCU 2110, but a separate MCU is not needed. That is, according to an embodiment of the present disclosure, even when each of the plurality of slave controllers 2100, 2200, and 2300 includes only one MCU 2110, the master controller 1000 may receive safety information about the battery cells through the plurality of communication channels. Accordingly, according to an embodiment of the present disclosure, the increase in the cost is minimized, and moreover, the safety of the BMS is enhanced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A communication method comprising:
performing bidirectional communication between a master controller and first to $N^{th}$ slave controllers through a first communication channel, the master controller connected to the first to $N^{th}$ slave controllers through the first communication channel in parallel, wherein N is an integer equal to or more than two; and
receiving, by the master controller, an indication signal through a second communication channel via the first to $N^{th}$ slave controllers, the master controller serially connected to the first to $N^{th}$ slave controllers through the second communication channel in a daisy chain manner, wherein the receiving of the indication signal comprises:
transmitting, by the master controller, a first indication signal to the first slave controller through the second communication channel;
determining, by the first slave controller, whether the first battery cell is abnormal, based on a sensing voltage or a sensing temperature of the first battery cell;
in response to determining that the first battery cell is abnormal, transmitting, by the first slave controller, a second indication signal to the second slave controller through the second communication channel, the second indication signal different from the first indication signal; and
in response to determining that the first battery cell is normal, transmitting, by the first slave controller, the first indication signal to the second slave controller.

2. The communication method of claim 1, wherein the receiving of the indication signal further comprises:
when the first indication signal is input through the second communication channel from the first slave controller, determining, by the second slave controller, whether the second battery cell is abnormal or not, based on a sensing voltage or a sensing temperature of the second battery cell;
when it is determined that the second battery cell is abnormal, transmitting, by the second slave controller, the second indication signal to the third slave controller through the second communication channel; and
when it is determined that the second battery cell is normal, transmitting, by the second slave controller, the first indication signal to the third slave controller.

3. The communication method of claim 2, wherein the receiving of the indication signal further comprises, when the second indication signal is input through the second communication channel from the first slave controller, transmitting, by the second slave controller, the second indication signal to the third slave controller through the second communication channel.

4. The communication method of claim 3, wherein the receiving of the indication signal further comprises transmitting, by the $N^{th}$ slave controller, the first indication signal or the second indication signal to the master controller through the second communication channel.

5. The communication method of claim 4, further comprising:
when the second indication signal is input, determining, by the master controller, one of the first battery cell to an $N^{th}$ battery cell as abnormal; and
searching for, by the master controller, abnormal battery cell in communication with the first to $N^{th}$ slave controllers through the first communication channel.

6. A battery management system comprising:
first to $N^{th}$ battery cells, wherein N is an integer equal to or more than two;
first to $N^{th}$ slave controllers respectively connected to the first to $N^{th}$ battery cells; and
a master controller connected to the first to $N^{th}$ slave controllers through a first communication channel in parallel, and serially connected to the first to $N^{th}$ slave controllers through a second communication channel in a daisy chain manner, wherein
the master controller is configured to transmit a first indication signal to the first slave controller through the second communication channel, the first slave controller is configured to determine whether the first battery cell is abnormal, based on a sensing voltage or a sensing temperature of the first battery cell, in response to determining that the first battery cell is abnormal, the first slave controller is configured to transmit a second indication signal, which is different from the first indication signal, to the second slave controller through the second communication channel, and in response to determining that the first battery cell is normal, the first slave controller is configured to transmit the first indication signal to the second slave controller.

7. The battery management system of claim 6, wherein
the master controller performs bidirectional communication with each of the first to $N^{th}$ slave controllers through the first communication channel, and
the master controller receives, through the second communication channel, an indication signal transmitted via the first to $N^{th}$ slave controllers.

8. The battery management system of claim 6, wherein
the first to $N^{th}$ slave controllers are defined as a slave controller group,
the first communication channel comprises a bus line disposed between the master controller and the slave controller group, and
the master controller communicates with each of the first to $N^{th}$ slave controllers through the bus line.

9. The battery management system of claim 6, wherein,
when the first indication signal is input through the second communication channel from the first slave controller, the second slave controller determines whether the second battery cell is abnormal or not, based on a sensing voltage or a sensing temperature of the second battery cell,
when it is determined that the second battery cell is abnormal, the second slave controller transmits the second indication signal to the third slave controller through the second communication channel, and
when it is determined that the second battery cell is normal, the second slave controller transmits the first indication signal to the third slave controller.

10. The battery management system of claim 9, wherein, when the second indication signal is input through the second communication channel from the first slave controller, the second slave controller transmits the second indication signal to the third slave controller through the second communication channel.

11. The battery management system of claim 10, wherein the $N^{th}$ slave controller transmits the first indication signal or the second indication signal to the master controller through the second communication channel.

* * * * *